US009620222B1

(12) United States Patent
Minemura et al.

(10) Patent No.: US 9,620,222 B1
(45) Date of Patent: Apr. 11, 2017

(54) SEMICONDUCTOR DEVICE AND METHOD FOR OPERATING THE SAME

(71) Applicant: Kabushiki Kaisha Toshiba, Minato-ku (JP)

(72) Inventors: Yoichi Minemura, Yokkaichi (JP); Yasuhiro Shimura, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/268,040

(22) Filed: Sep. 16, 2016

Related U.S. Application Data

(60) Provisional application No. 62/302,277, filed on Mar. 2, 2016.

(51) Int. Cl.
| | | |
|---|---|---|
| *G11C 16/08* | (2006.01) | |
| *G11C 16/10* | (2006.01) | |
| *G11C 16/04* | (2006.01) | |
| *G11C 16/34* | (2006.01) | |
| *G11C 16/16* | (2006.01) | |

(52) U.S. Cl.
CPC .......... *G11C 16/10* (2013.01); *G11C 16/0483* (2013.01); *G11C 16/3459* (2013.01); *G11C 16/08* (2013.01); *G11C 16/16* (2013.01)

(58) Field of Classification Search
CPC .......... G11C 16/08; G11C 16/10; G11C 16/16
USPC ............................. 365/185.11, 185.18, 185.17
See application file for complete search history.

(56) References Cited

U.S. PATENT DOCUMENTS

| | | |
|---|---|---|
| 7,492,634 B2 | 2/2009 | Li et al. |
| 2010/0238729 A1* | 9/2010 | Lee .................. G11C 11/5628 365/185.11 |
| 2011/0176367 A1 | 7/2011 | Edahiro |
| 2013/0077409 A1 | 3/2013 | Shiino et al. |
| 2013/0141971 A1 | 6/2013 | Hosono |

FOREIGN PATENT DOCUMENTS

| | | |
|---|---|---|
| JP | 2011-150749 | 8/2011 |
| JP | 2012-160236 | 8/2012 |
| JP | 2013-69373 | 4/2013 |

* cited by examiner

*Primary Examiner* — Jason Lappas
(74) *Attorney, Agent, or Firm* — Oblon, McClelland, Maier & Neustadt, L.L.P.

(57) ABSTRACT

The semiconductor device includes memory strings, word lines, bit lines and a circuit. The memory strings each include memory cells connected in series. The gate electrode surrounds the channel. The word lines are electrically connected to gate electrodes of memory cells. The bit lines are electrically connected to ends of current paths in the memory strings respectively. The circuit controls a program operation of information. The information includes at least three of a first, a second and a third levels or more corresponding to threshold voltages of the memory cells. When starting the program operation, the circuit applies a program selection voltage to channels of memory cells to be programmed at the second level, and a program suppression voltage to channels of memory cells maintaining the first level and channels of memory cells to be programmed at the third level.

20 Claims, 14 Drawing Sheets

SEMICONDUCTOR DEVICE AND METHOD FOR OPERATING THE SAME

CROSS-REFERENCE TO RELATED APPLICATIONS

This application is based upon and claims the benefit of priority from U.S. Provisional Patent Application 62/302,277 filed on Mar. 2, 2016; the entire contents of which are incorporated herein by reference.

FIELD

Embodiments described herein relate generally to a semiconductor device and a method for operating the same.

BACKGROUND

A memory device having a three-dimensional structure is proposed, in which a memory hole is formed in a stacked body including a plurality of electrode layers stacked therein, and a charge storage film and a semiconductor film are provided in the memory hole so as to extend in the stacked direction of the stacked body. The memory device includes a plurality of memory cells that are connected in series between a drain side selection transistor and a source side selection transistor. The electrode layers in the stacked body are gate electrodes of the drain side selection transistor, the source side selection transistor and the memory cells. A gate electrode of a memory cell is a word line. There are three main capacities induced around a word line (i.e. parasitic capacities of word lines) such as line-to-line capacities between word lines, between a word line and a source line, and between a word line and a channel. When a parasitic capacity of the word line is large, for example, a programming speed becomes slower. In the memory device having the three-dimensional structure, the capacity between word line and channel composes almost half of the parasitic capacity of the word line in the program operation. It is desired in the program operation to reduce the capacity between word line and channel.

DETAILED DESCRIPTION

According to one embodiment, a semiconductor device includes a plurality of memory strings. The memory strings include a plurality of memory cells connected in series. The memory cells each include a gate electrode, a channel and a charge storage portion. The gate electrode surrounds the channel, and the charge storage portion is provided between the gate electrode and the channel. The device further includes a plurality of word lines, the word lines being electrically connected to gate electrodes of the memory cells respectively; a plurality of bit lines electrically connected to ends of current paths in the memory strings respectively; and a circuit controlling a program operation of information. The information includes at least three of a first level, a second level and a third level, or more corresponding to threshold voltages of the memory cells. A threshold voltage of the second level is higher than a threshold voltage of the first level. A threshold voltage of the third level is higher than the threshold voltage of the second level. When starting the program operation, the circuit applies a program selection voltage to channels of memory cells to be programmed at the second level, and a program suppression voltage to channels of memory cells maintaining the first level and channels of memory cells to be programmed at the third level. The program suppression voltage is higher than the program selection voltage.

Hereinafter, a first embodiment is described with reference to the drawings. It should be noted that the same elements are denoted in each drawing by the same symbols. A semiconductor device according to the embodiment is a semiconductor memory device having a memory cell array.

First Embodiment

Figure 1:
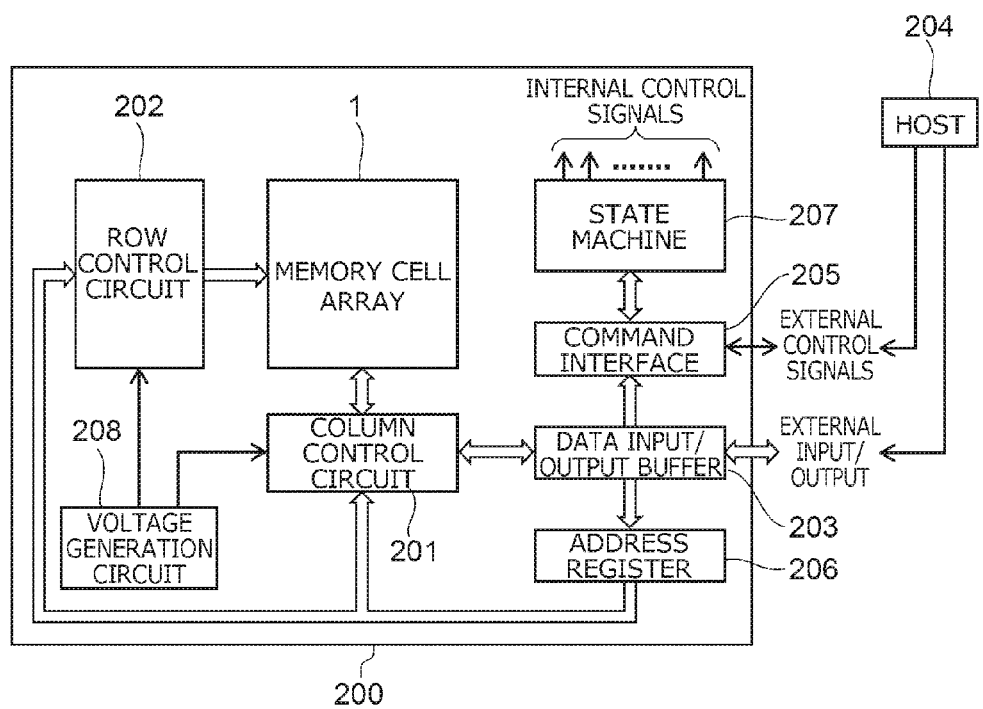
FIG. 1 is a schematic block diagram of a semiconductor device according to a first embodiment.
Figure 2:
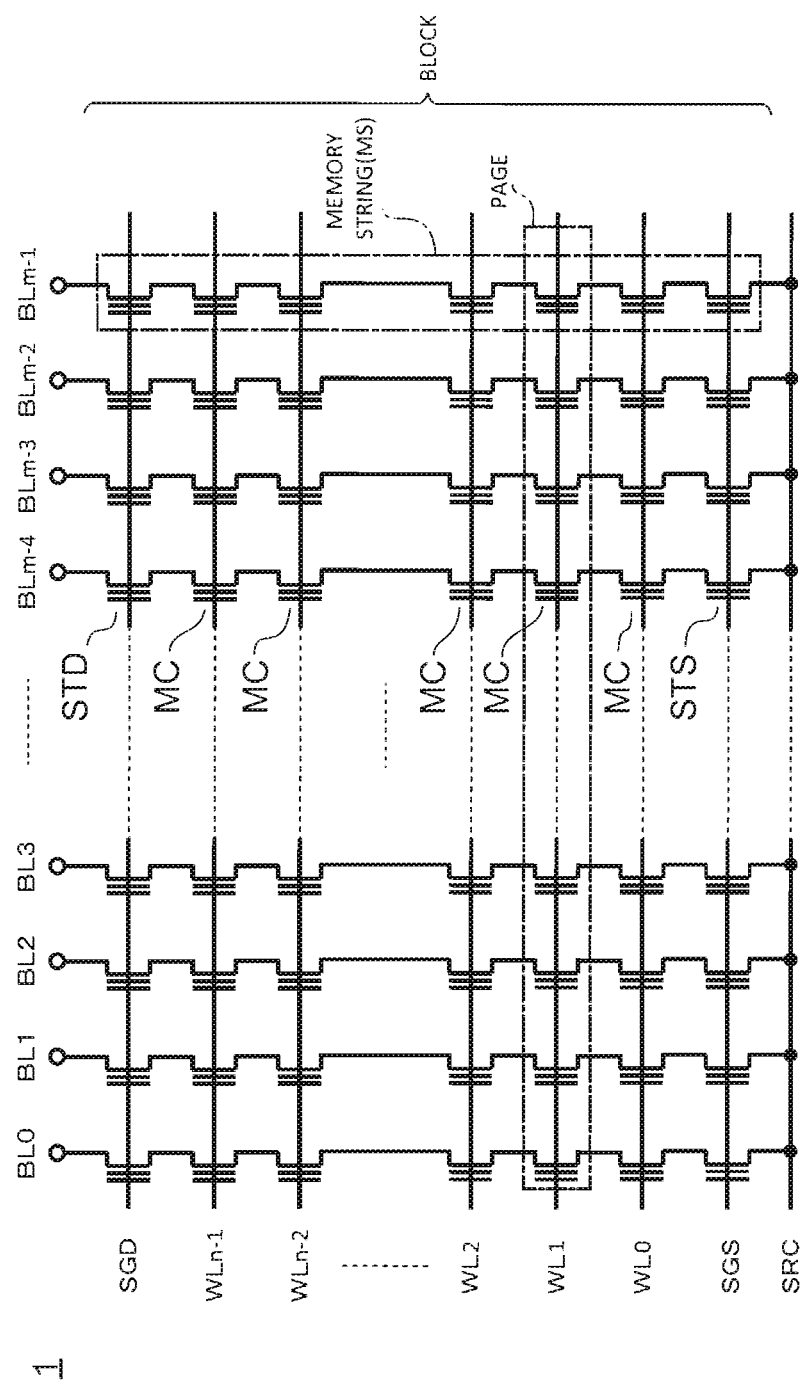
FIG. 2 is a schematic circuit diagram of a memory cell array.
Figure 3:
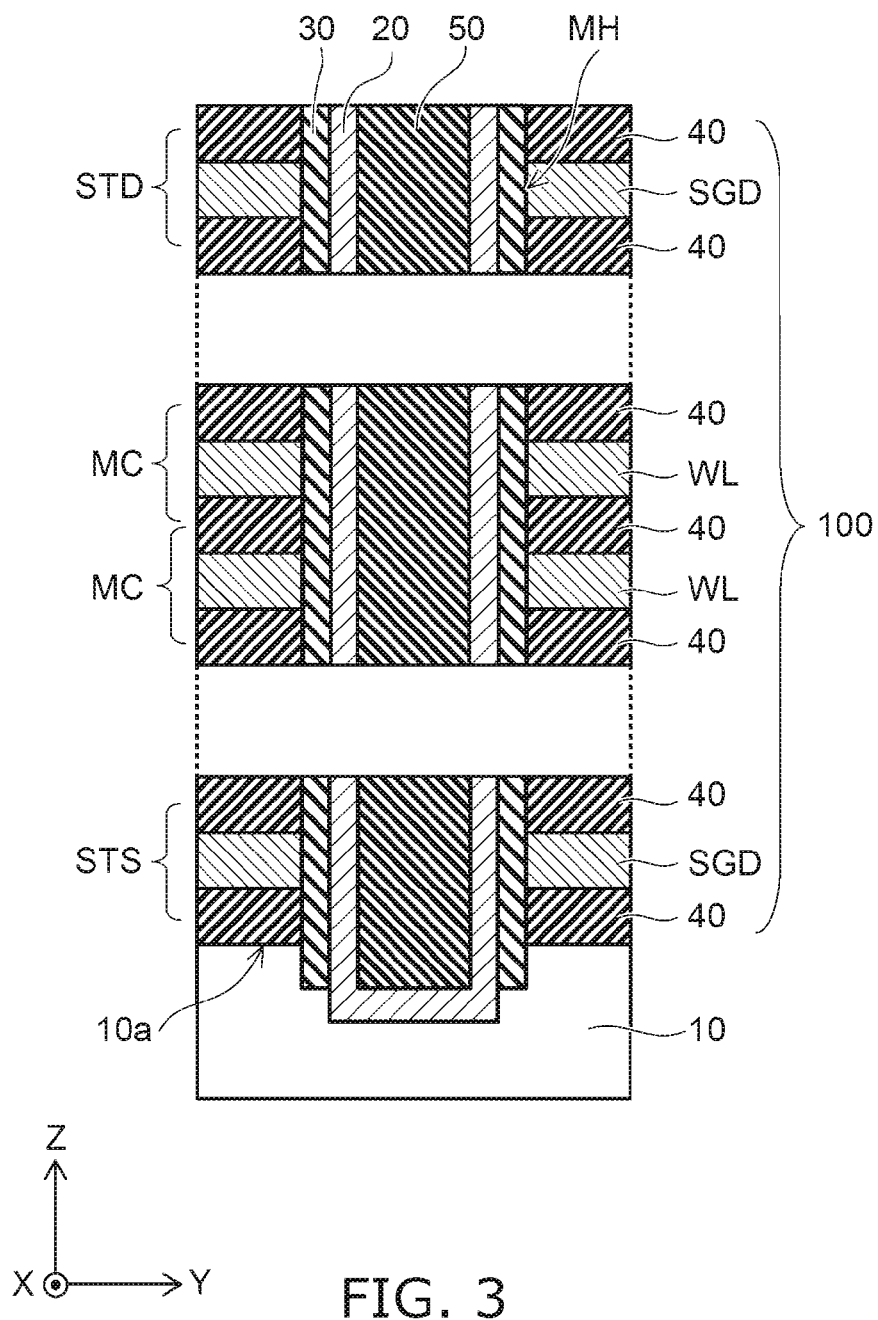
FIG. 3 is a schematic cross-sectional view of three-dimensional structure type selection transistors and memory cells.

FIG. 1 is a schematic block diagram of a semiconductor device 200 according to a first embodiment. FIG. 2 is a schematic circuit diagram of a memory cell array 1. FIG. 3 is a schematic cross-sectional view of three-dimensional structure type STD, MC, STS.

As shown in FIG. 1, the semiconductor device 200 includes the memory cell array 1.

As shown in FIG. 2, a drain side selection transistor STD, a memory cell MC and a source side selection transistor SGS are provided in the memory cell array 1. A plurality of memory cells MC are connected in series between the drain side selection transistor STD and the source side selection transistor STS. These are referred to as "a memory string MS". Each of the current paths of a plurality of memory strings MS is electrically connected in common to a source line SRC at each one end thereof. Other ends of the current paths of the plurality of memory strings MS are electrically connected to bit lines BL (BL0 to BLm-1) respectively. The drain side selection transistor STD, the memory cell MC and the source side selection transistor STS are, for example, the three-dimensional structure type. Schematic cross-sectional views of the three-dimensional structure type drain side selection transistor STD, memory cells MC and source side selection transistor STS are shown in FIG. 3.

As shown in FIG. 3, a stacked body 100 is provided on a major surface 10a of a substrate 10. The stacked body 100 includes insulators 40 and electrode layers (SGD, WL and SGS). The insulators 40 and the electrode layers (GGD, WL and SGS) are alternately stacked. The electrode layers (SGD, WL and SGS) spread in parallel to the major surface 10a of the substrate 10 (a XY-plane). A memory hole MH is provided in the stacked body 100. The memory hole MH extends along a stacking direction of the stacked body 100 (a Z-direction). A memory film 30, a channel 20 and a core layer 50 are provided in the memory hole MH. The memory film 30 includes charge storage portions in the film. The charge storage portions have trapping sites that trap electric charges. A threshold voltage in a memory cell MC changes depending on existence or non-existence of electric charges trapped in the trapping site, or an amount of electric charges trapped therein. Thereby, the memory cells MC stores information. The channel 20 is a semiconductor layer. The memory film 30 and the channel 20 extend along the Z-direction orthogonal to the electrode layers (SGD, WL and SGS). The core layer 50 is an insulator, and fills the memory hole MH in which the memory film 30 and the channel 20 are provided.

As shown in FIG. 2, gate electrodes of drain side selection transistors STD are electrically connected to a drain side selection gate line SGD. Gate electrodes of memory cells MC are electrically connected to word lines WL (WL0 to WLn-1). Gate electrodes of source side selection transistors STS are electrically connected to a source side selection gate line SGS. The number of memory cells sharing one word line is the minimum unit in programming and reading out. This is referred to as "a page". In this example, one page includes "m" memory cells MC. Moreover, a plurality of "pages" and a plurality of "memory strings MS" configure a unit referred to as "a block". The "block" is the minimum unit in erasing.

As shown in FIG. 1, a column control circuit 201 and a row control circuit 202 are provided outside the memory cell array 1.

The column control circuit 201 controls the voltages of bit lines BL and the source line SRC in operations of reading information out from the memory cells MC, programming information into the memory cells and erasing information in the memory cells MC.

The row control circuit 202 controls the voltages of word lines WL and the source side selection gate line SGS in the operations of reading out, programming, and erasing.

A data input/output (I/O) buffer 203 inputs information into the semiconductor device 200, and outputs information from the semiconductor device 200. For example, input information (external input) transmitted from a host controller 204 is input to the data I/O buffer 203. Also, the data I/O buffer 203 transmits output information (external output) to the host controller 204.

The external input includes, for example, command data, data address and program control data. The command data is output to a command interface (I/F) 205 from the data I/O buffer 203. The data address is output to an address register 206 from the data I/O buffer 203. The program control data is output to the column control circuit 201 from the data I/O buffer 203. The external output includes, for example, read data.

For example, an external control signal transmitted from the host controller 204 is input to the command I/F 205. The command I/F 205 determines, based on the external control signal, whether the external input that is input to the data I/O buffer 203 is, for example, a command data, a data address or program control data. When the external input is the command data, the command I/F 205 transmits the command data to a state machine 207.

The state machine 207 manages the whole operation of the semiconductor device 200. The state machine 207 generates an internal control signal based on the command data. The internal control signal is used, for example, for controlling the read operation, the program operation and the erase operation. The internal control signal is output, for example, to the column control circuit 201, the row control circuit 202 and a voltage generation circuit 208. Moreover, the state machine manages the information that shows an operation status in the semiconductor device 200 (status information). The status information may also be output to the host controller, for example, depending on demands.

The voltage generation circuit 208 generates internal voltage based on the internal control signal, which is necessary for the read operation, the program operation and the erase operation. The generated internal voltage is supplied, for example, to the column control circuit 201 and the raw control circuit 202.

Figure 4:
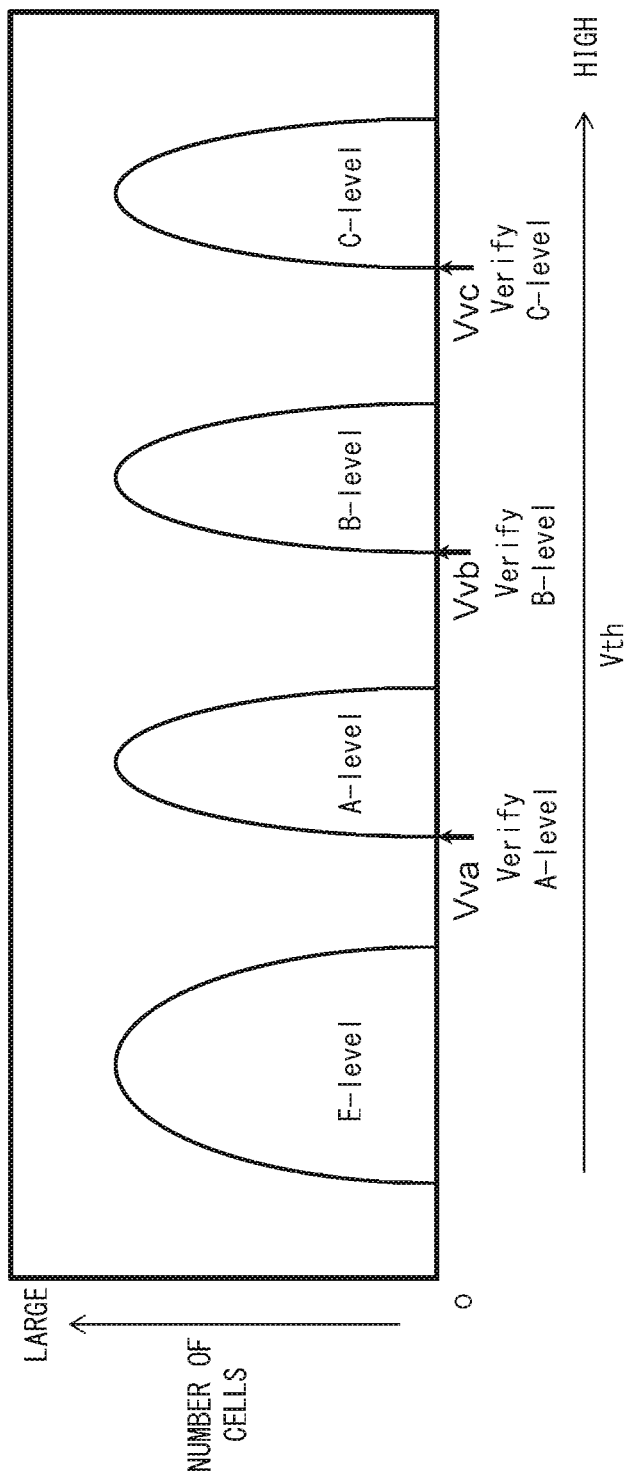
FIG. 4 is a chart showing program levels.

FIG. 4 is a chart showing program levels. In FIG. 4, the horizontal axis represents a threshold voltage (Vth), and the vertical axis represents a number of cells.

As shown in FIG. 4, the memory cell MC of the semiconductor device according to the first embodiment is a multi-level cell. The multi-level cell is capable of storing three data or more. Multi-level cells, each of which holds four data such as "E-level", "A-level", "B-level" and "C-level", store information by two bit per one cell. E-, A-, B- and C-levels correspond to the threshold voltage levels of the memory cell MC respectively. The threshold voltage is lowest in E-level, E-level corresponds, for example, to a threshold voltage of the memory cell MC after the erase operation. The threshold voltage increases in order of A, B and C, and becomes highest in C-level. When programming information corresponding to A-, B- and C-levels into the memory cells MC, operations for shifting the threshold voltages (i.e. program operations) are performed.

Figure 5:
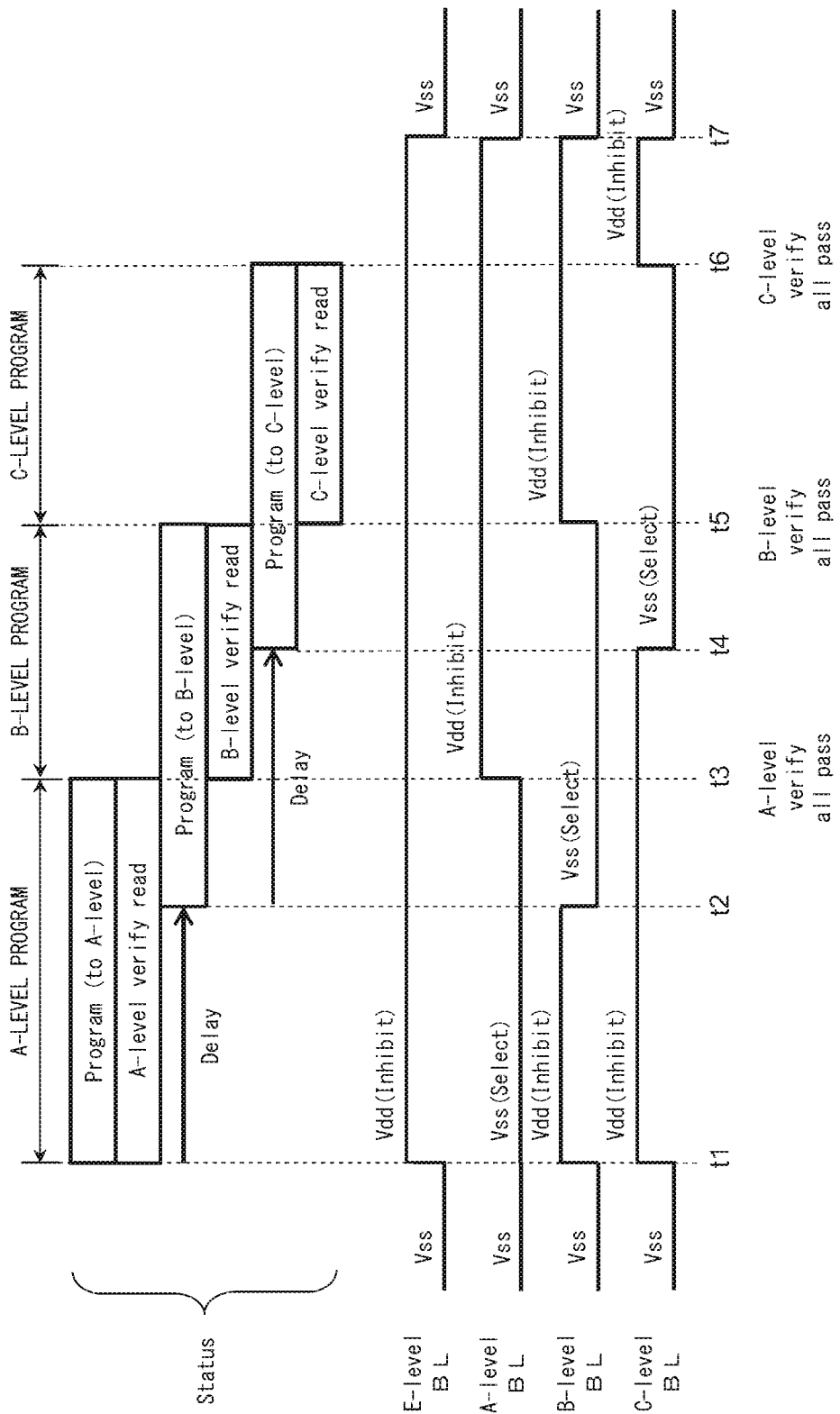
FIG. 5 is a schematic timing chart showing a program operation of the semiconductor device according to the first embodiment.
Figure 6:
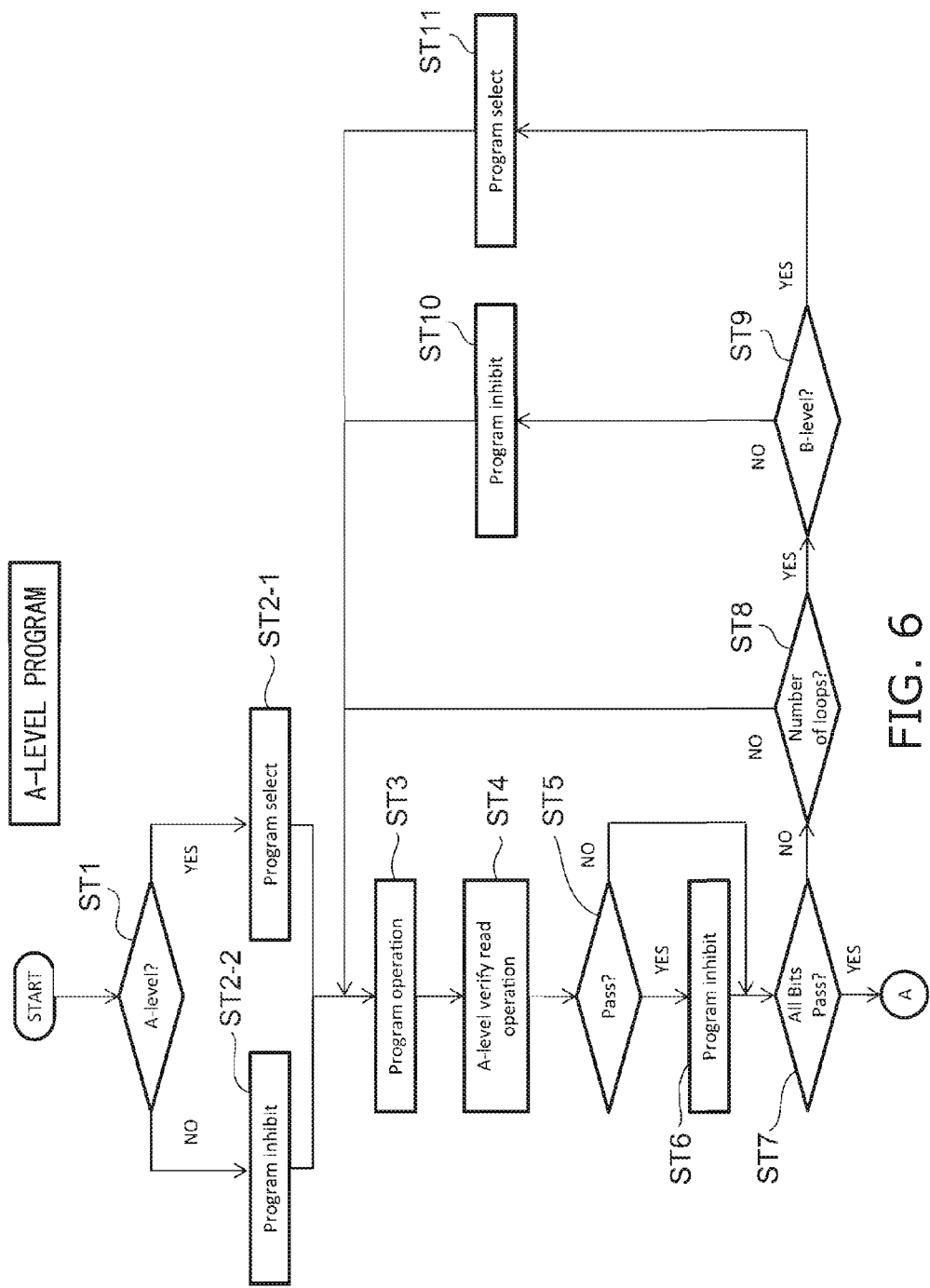
FIG. 6 is a flow chart showing A-LEVEL PROGRAM flow in the semiconductor device according to the first embodiment.
Figure 7:
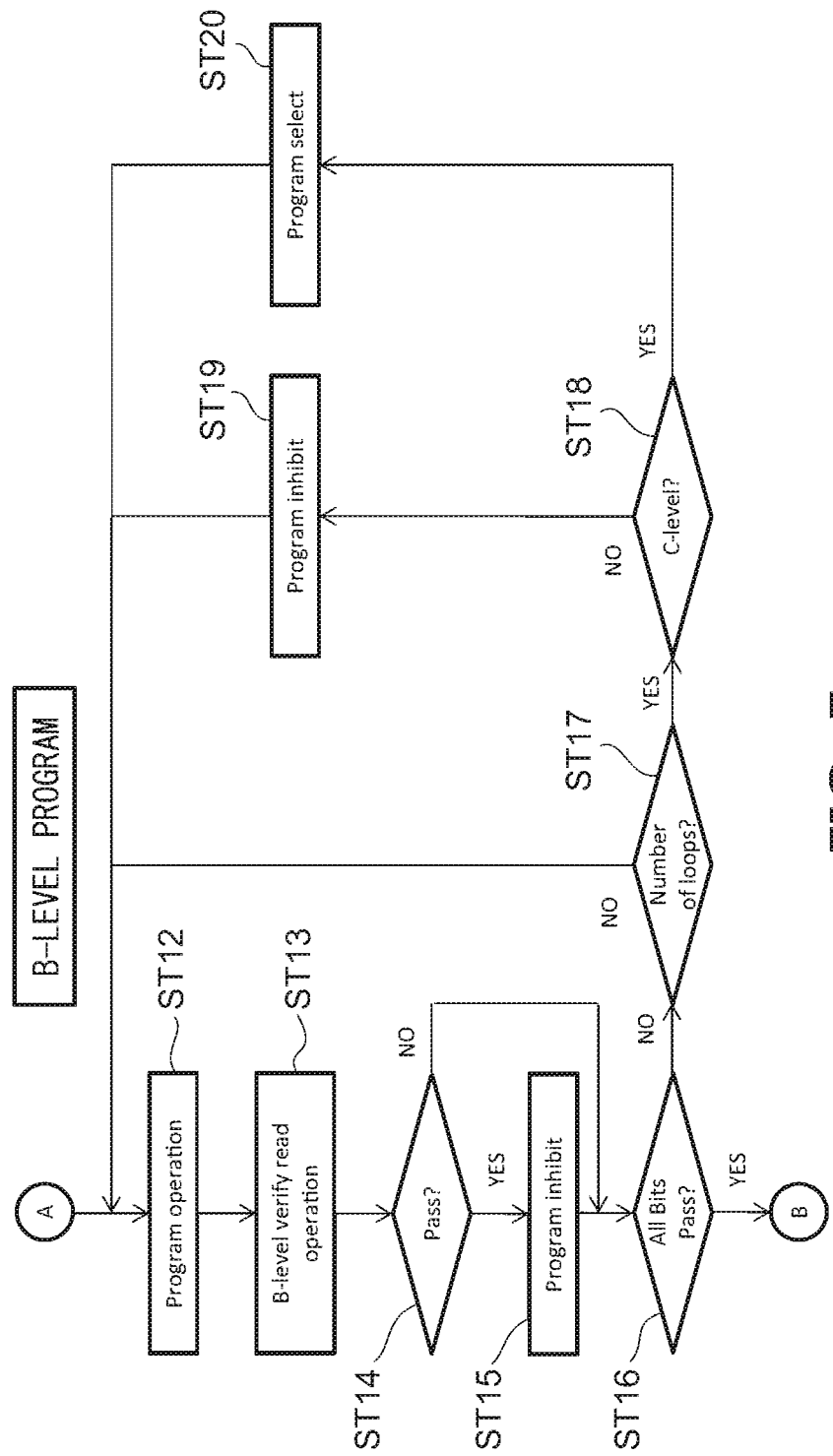
FIG. 7 is a flow chart showing B-LEVEL PROGRAM flow in the semiconductor device according to the first embodiment.
Figure 8:
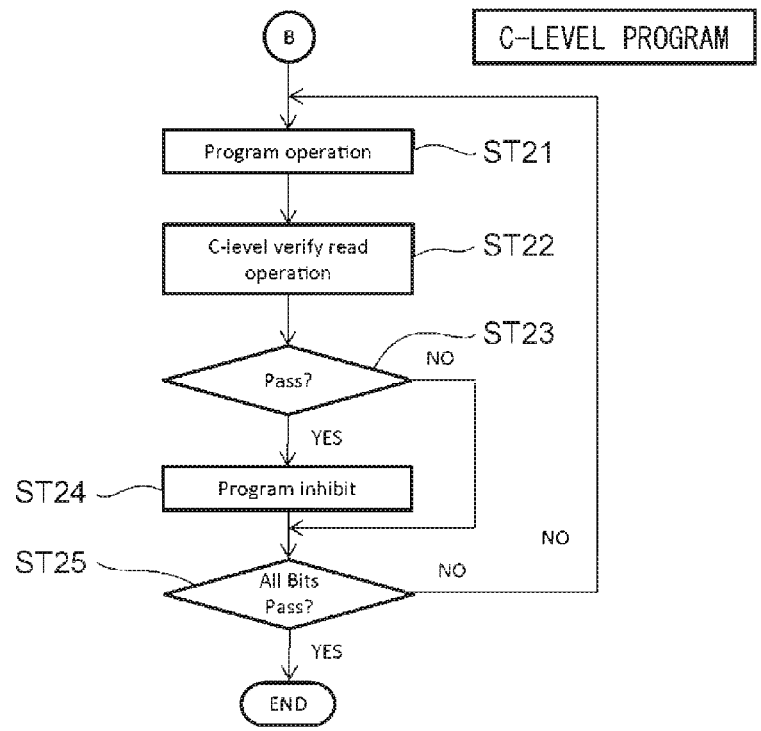
FIG. 8 is a flow chart showing C-LEVEL PROGRAM flow in the semiconductor device according to the first embodiment.

FIG. 5 is a timing chart showing program operations in the semiconductor device according to the first embodiment. FIG. 6 is a flow chart showing a flow of "A-LEVEL PROGRAM". FIG. 7 is a flow chart showing a flow of "B-LEVEL PROGRAM". FIG. 8 is a flow chart showing a flow of "C-LEVEL PROGRAM".

Program information is inputted to the data buffer, from, for example, the host controller. The program information, which is input to the data I/O buffer 203, is output to the column control circuit 201. For example, a page buffer, which transiently stores information by an amount stored in one page, is provided in the column control circuit. The program information is stored in the page buffer. Then, the program operations are started into the memory cells MC in the semiconductor device 200.

As shown in FIG. 4, the program operations are sequentially performed in ascending order of threshold voltage, i.e. in order of "A-LEVEL PROGRAM", "B-LEVEL PROGRAM" and "C-LEVEL PROGRAM". When the program operations are started, according to the program information stored in the page buffer, the voltages corresponding to the program information are applied to bit lines BL0 to BLm respectively that correspond to one page.

(A-Level Program)

In the first embodiment, it is determined whether information to be programmed is A-LEVEL or not as shown in a step ST1 of FIG. 6. When programming at A-LEVEL (YES) is determined as shown in a step ST2-1 of FIG. 6, a voltage for selecting a program mode (hereinafter a program selection voltage Vss (Select)) is applied at a time t1 in FIG. 5 to a bit line BL (A-level BL) connected to a memory cell MC that is programmed at A-LEVEL.

When programming at a level other than A-LEVEL (NO) is determined as shown in a step ST2-2 of FIG. 6, a voltage for selecting an inhibit mode (hereinafter a program suppression voltage Vdd (Inhibit)) is applied at a time t1 in FIG. 5 to bit lines BL (E-level BL, B-level BL and C-level BL).

These controls are performed, for example, by column control circuit 201. "E-level BL" is a bit line connected to a memory cell MC that is maintained at E-LEVEL; "B-level BL" is a bit line connected to a memory cell MC that is programmed at B-LEVEL; and "C-level BL" is a bit line connected to a memory cell MC that is programmed at C-LEVEL. The voltage Vss may be, for example, an internal ground voltage, and the voltage Vdd is the one higher than the voltage Vss. The voltage Vdd may be, for example, an internal source voltage.

As described above, when starting the program operations in the first embodiment, the program selection voltage Vss (Select) is applied to the bit line BL corresponding to the memory cell MC that is programmed at A-LEVEL. Moreover, the program suppression voltage Vdd (Inhibit) is applied to the bit line BL corresponding to the memory cell MC that is maintained at E-LEVEL or that is programmed at B-LEVEL or C-LEVEL.

Then, the program operations are stated (ST3 in FIG. 6). In the program operation, for example, the voltage Vss is applied to the source side selection gate line SGS; and the voltage Vdd is applied to the drain side selection gate line SGD. Furthermore, a passing voltage Vpass, which makes memory cells MC turn on without relation to the threshold voltages held therein, is applied to word lines WL (WL0 to WLn-1). Thereby, the voltages corresponding to the program information are applied via the bit lines BL0 to BLm-1 to the channels of memory cells MC corresponding to one page. At this time, among the voltages applied to the channels of the memory cells MC corresponding to one page, the voltage Vss is applied to a channel of a memory cell MC that is programmed at A-LEVEL. Moreover, a voltage that is almost the same as the voltage Vdd is applied to the memory cells MC that are programmed at a level other than A-LEVEL. The voltages of the source side selection gate line SGS, the drain side selection gate line SGD and the word lines WL are controlled, for example, by the row control circuit 202.

Then, the row control circuit 202 raises a voltage of one word line WL, which is selected from the word lines WL0 to WLn-1, from the passing voltage Vpass to the programming voltage Vpgm that is higher than the passing voltage Vpass. Thus, charge injections into a charge storage portion occur in a memory cell MC in which the voltage Vss is applied to a channel, and shift the threshold voltage thereof, for example, in the positive direction. Moreover, as a voltage difference between a word line WL and a channel is small, charge injections into a charge storage portion are suppressed in a memory cell MC in which the voltage Vdd is applied to the channel. As a result, a shift in the positive direction of the threshold voltage is suppressed therein. Here, the memory cells MC in the semiconductor device 200 according to the first embodiment are three-dimensional structure type.

Figure 9:
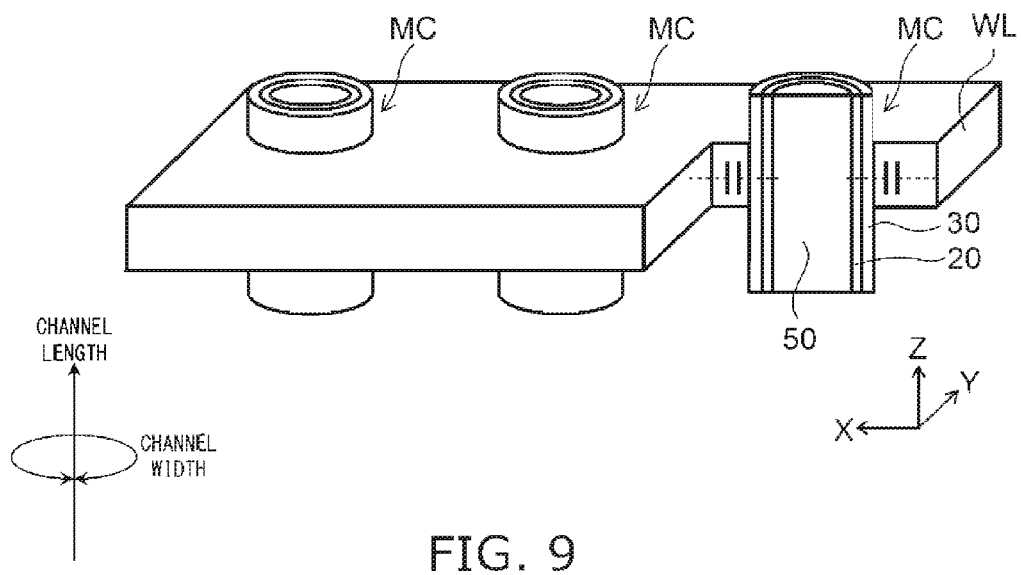
FIG. 9 is a schematic perspective view of the three-dimensional structure type memory cells.
Figure 10:
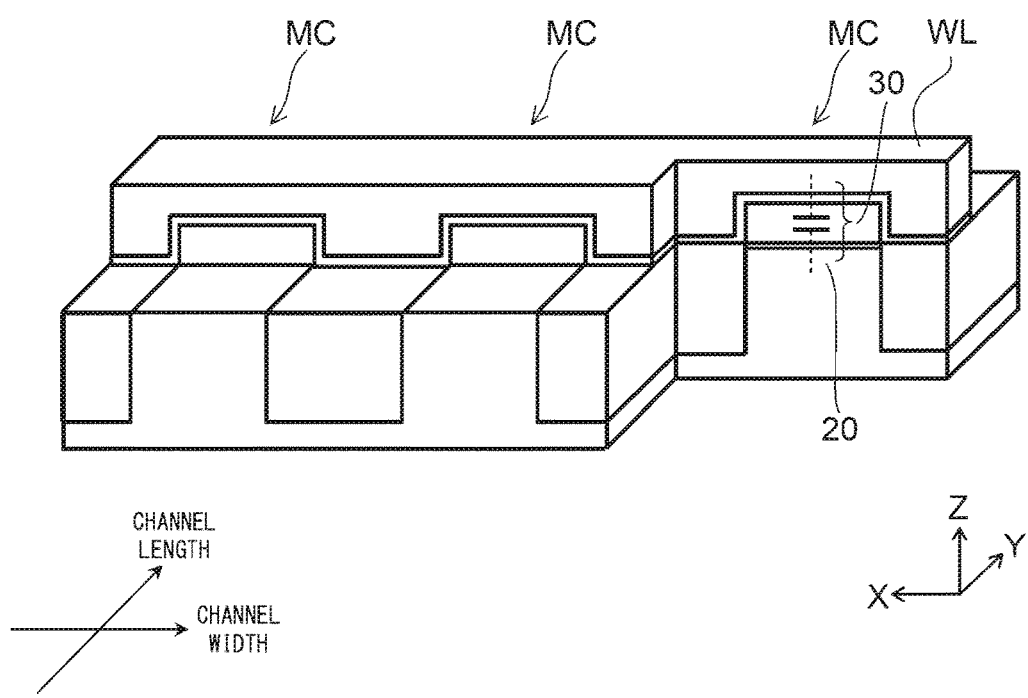
FIG. 10 is a schematic perspective view of two-dimensional structure type memory cells.

FIG. 9 is a perspective view of the three-dimensional structure type memory cells. FIG. 10 is a perspective view of two-dimensional structure type memory cells MC.

As shown in FIG. 9, a three-dimensional structure type memory cell MC has a structure, for example, in which a channel 20 extends through a word line WL. Thus, the channel 20 is surrounded around 360 degrees, for example, via a memory film 30 by the word line WL.

In contrast, in a two-dimensional structure type memory cell MC, a channel 20 faces only one surface of a word line WL via a memory film 30 that includes a charge storage portion 30 as shown in FIG. 10. Thus, a capacitance between the word line WL and channel 20 is structurally small comparing to the three-dimensional structure type memory cell MC.

Furthermore, in the two-dimensional structure type memory cells MC, a plurality of memory cells MC arranged in one direction are provided with respect to one word line WL in contrast, in the three-dimensional structure type, a plurality of memory cells MC disposed in a tow-dimensional array, for example, in the X-Y directions are provided with respect to one word line WL. Thus, the number of memory cells MC connected to one word line WL is larger in the three-dimensional structure type memory cells MC than that in the two-dimensional structure type memory cells MC.

An influence of parasitic capacitance between a word line WL and a channel 20 becomes significant in the three-dimensional structure type memory cells MC, since such a parasitic capacitance is structurally large in the three-dimensional structure type memory cells MC, whereas being ignored in the two-dimensional structure type memory cells MC.

For example, in the three-dimensional structure type memory cells MC, a variation range of RC time constants in word lines WL is large, which corresponds to data patterns equal to the amount of "one page" programmed in the program operation, comparing to the two-dimensional structure type memory cells MC. When a RC time constant of a word line WL is large in the program operation, rise of voltage in the word line WL is delayed. Thereby, it becomes hard to program into the memory cell MC, and it influences on an operation rate in the programming.

Moreover, in the programming, the voltage applied to a word line WL is set such that a programming pulse width and rise rate, for example, are adequate to a RC time constant in the worst case. Thus, it provides a case where excessive characteristics are achieved in a word line WL having a small RC time constant, and programming into a memory cell MC is excessively easy. When programming into a memory cell MC is excessively easy, erroneous programming such as programming or passing disturbance or over programming may be induced.

Figure 11:
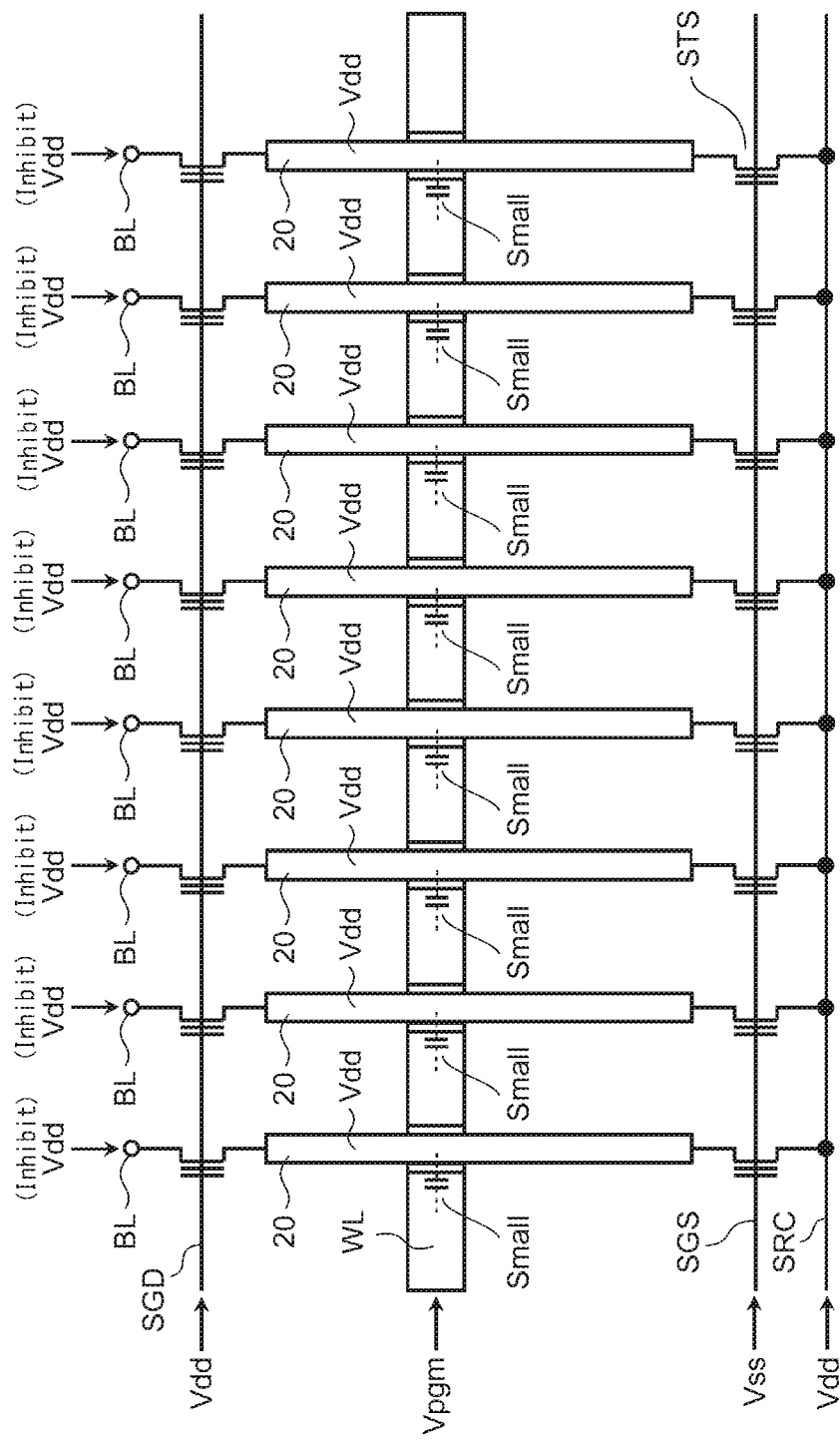
FIG. 11 is a view showing a parasitic capacity between a word line and a channel at a program operation.
Figure 12:
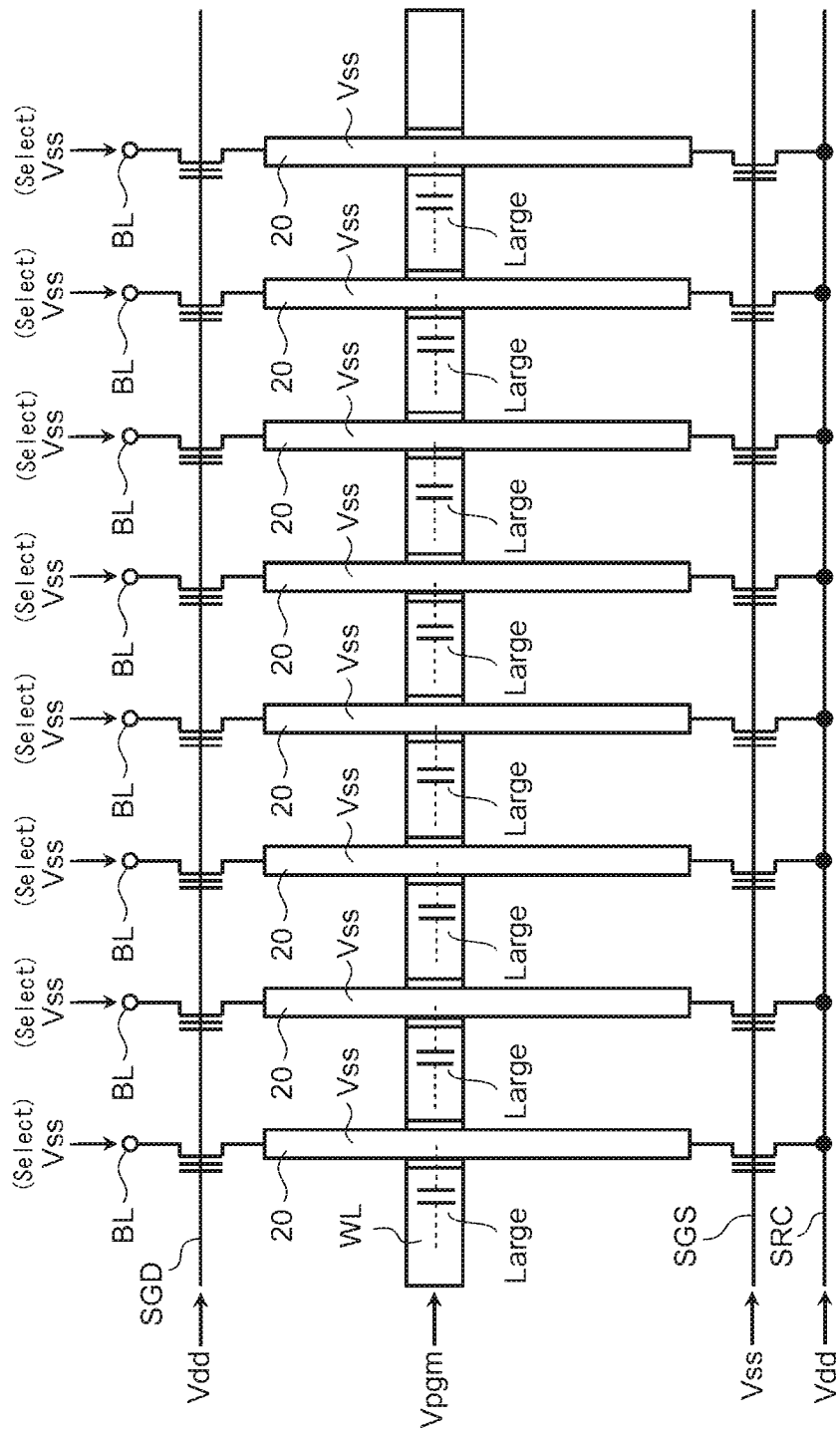
FIG. 12 is a view showing a parasitic capacity between a word line and a channel at a program operation.

FIGS. 11 and 12 are views showing a parasitic capacity between a word line WL and a channel 20 at a program operation. In a case shown in FIG. 11, the program suppression voltage Vdd (Inhibit) is applied to bit lines BL. In a case shown in FIG. 12, the program selection voltage Vss (Select) is applied to the bit lines BL.

As shown in FIG. 11, voltages of channels 20 are almost the same as the voltage Vdd, when the program suppression voltage Vss (Inhibit) is applied to the bit lines BL. In contrast, the voltages of channels 20 are the same as the voltage Vss as shown in FIG. 12, when the program selection voltage Vss (Select) is applied to the bit lines BL. The voltage difference between the word lines WL and the channels 20 also relate to the parasitic capacity between the word lines WL and the channels 20. In the program operation, the parasitic capacity between the word lines WL and the channels 20 becomes maximum (e.g. see FIG. 12), when all voltages of channels 20 that correspond to "one page" are the voltage Vss. In contrast, the total parasitic capacity between the word lines WL and the channels 20 is minimum value (e.g. see FIG. 11), when all voltages of channels 20 that correspond to "one page" are almost the same as the voltage Vdd.

Figure 13:
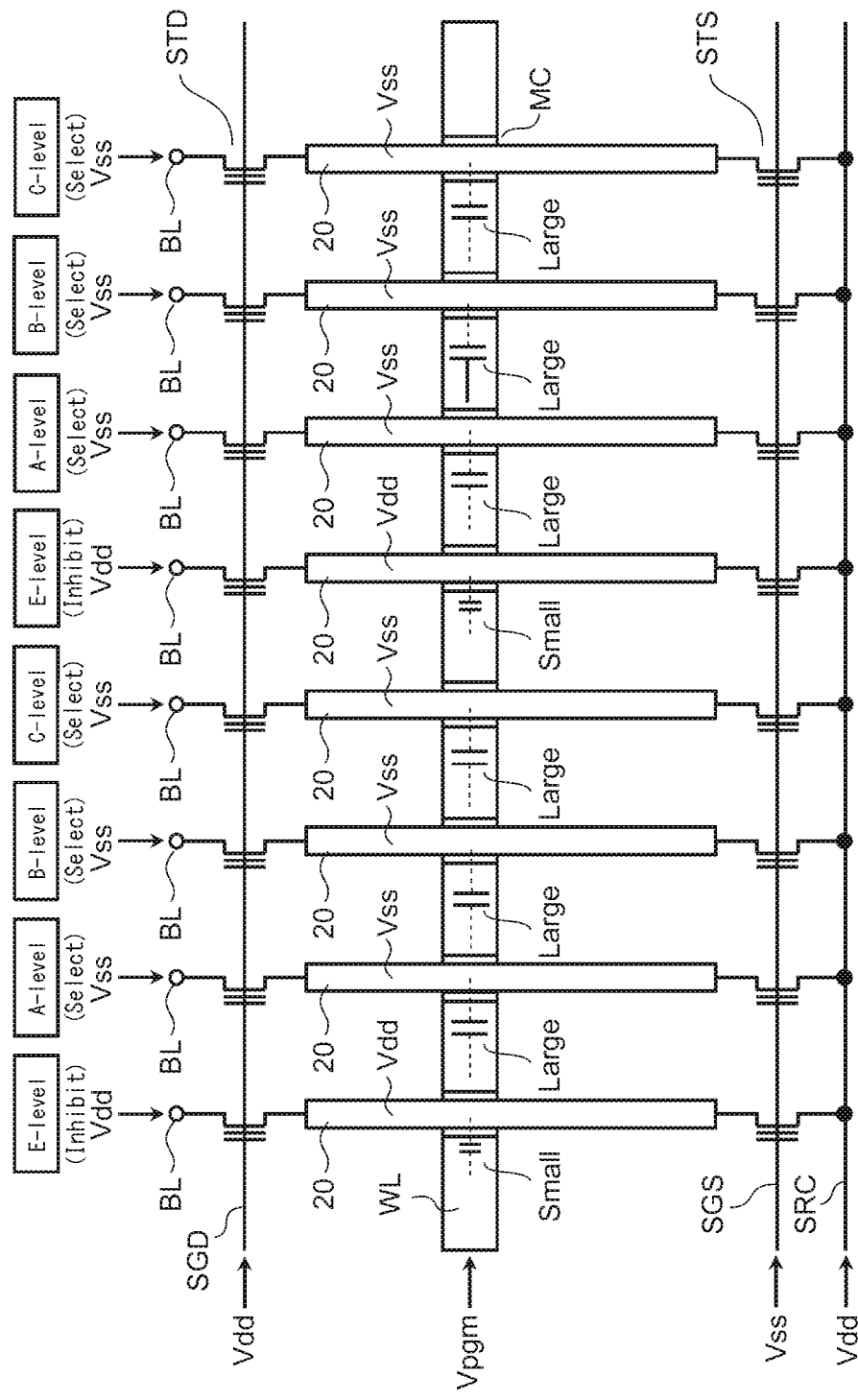
FIG. 13 is a view showing potentials in bit lines when starting A-LEVEL PROGRAM according to a comparative example.
Figure 14:
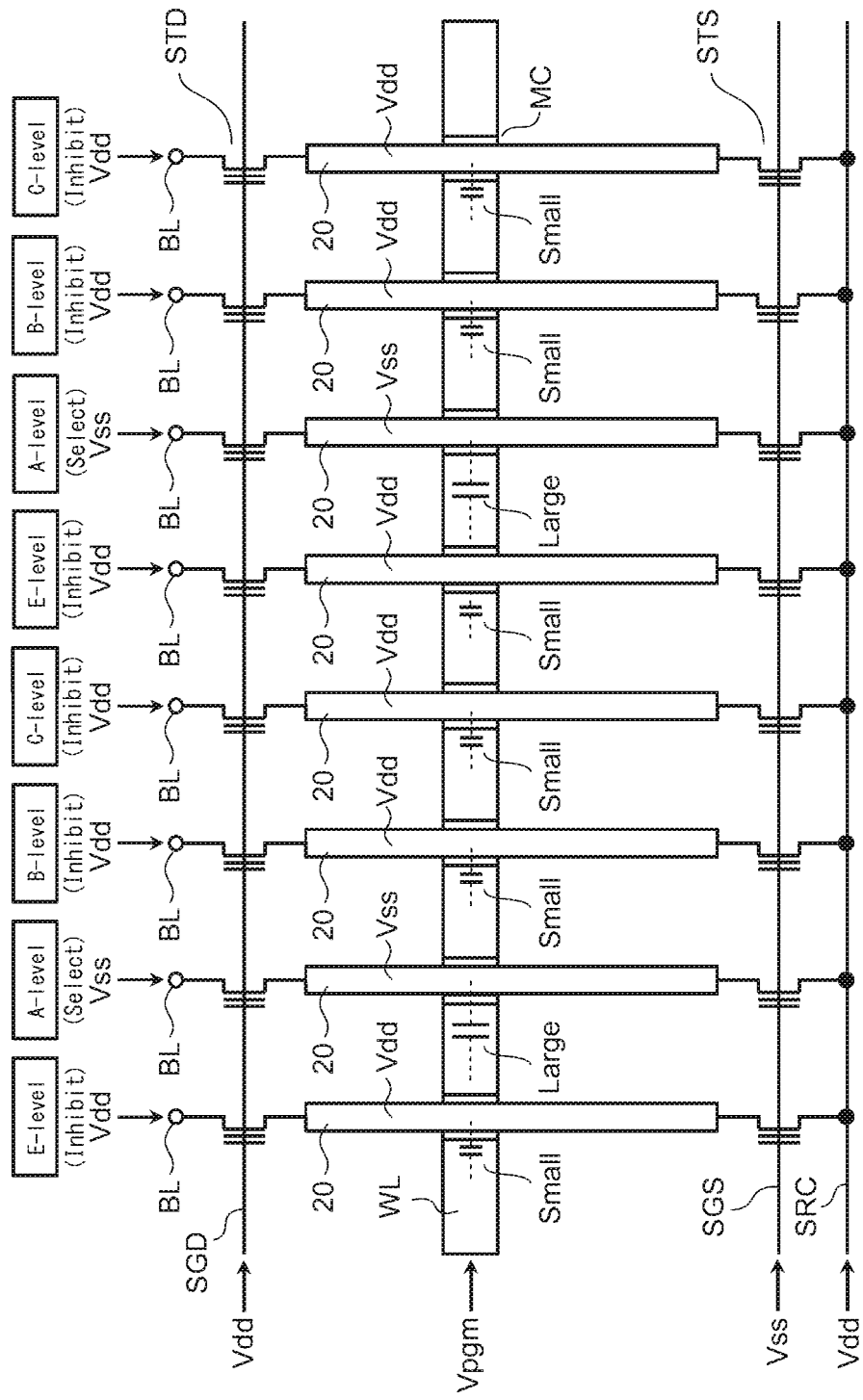
FIG. 14 is a view showing potentials in bit lines when starting A-LEVEL PROGRAM according to the first embodiment.

FIG. 13 is a view showing voltages in bit lines BL when starting A-LEVEL programming according to a comparative example. FIG. 14 is a view showing voltages in bit lines BL when starting A-LEVEL programming according to the first embodiment.

A program operation is the one that causes a threshold voltage of a memory cell MC to be shifted. Thus, when starting, for example, A-LEVEL programming, the program selection voltage Vss (Select) is generally applied also to channels of memory cells MC in which programming is performed at B-LEVEL and C-LEVEL as shown in FIG. 13.

In contrast, when starting A-LEVEL programming in the first embodiment, the program suppression voltage Vdd (Inhibit) is applied to the channels of memory cells MC in which programming is performed at B-LEVEL and C-LEVEL as shown in FIG. 14. In this manner, the memory cells MC are increased, in which the voltage of channels is almost the same as the voltage Vdd. Thereby, the increase of the total parasitic capacity between the word lines WL and the cannel bodies 20 is suppressed in the program operation.

Under this condition, a step ST3 of the program operation shown in FIG. 6 is performed. As mentioned above, the voltage of the selected word line WL is raised in the program operation from the passing voltage Vpass to the programming voltage Vpgm. Thereby, electric charges (electrons) are injected into the charge storage portion of the memory cell MC in which programming is performed at A-LEVEL, and the threshold voltage of the memory cell MC is shifted in the positive direction.

Then, as shown in a step 4, a threshold voltage of a memory cell MC is verified whether being raised up to A-LEVEL or not. The verifying is carried out by performing a verify-read operation.

The steps ST3 and ST4 are repeated until all threshold voltages of memory cells MC in which programming is performed at A-LEVEL are found to be A-LEVEL. The steps ST3 and ST4 are performed as a loop sequence, which is executed in parallel with respect to the memory cells corresponding to "one page".

In the verify-read operation in the step ST4, the read operation is performed under a verify-read voltage Vva (see FIG. 4) applied to the selected word line WL (at a time t1 in FIG. 5). When a memory cell MC is turned "on" during this read operation, the threshold voltage thereof is determined not to be raised up to A-LEVEL (determined not to pass, i.e. "NO") at a step ST5. In this case, the program selection voltage Vss (Select) is applied to the bit line BL, and the threshold voltage thereof is shifted again in the next program operation.

When the memory cell is turned "off", the threshold voltage thereof is determined to be raised up to A-LEVEL (pass at a step ST5, i.e. "YES"). In this case, the voltage of the bit line BL is changed from the program selection voltage Vss (Select) to the program suppression voltage Vdd (Inhibit). Thereby, the shift of the threshold voltage is suppressed in the next and following program operations. This voltage change in the bit line BL is performed, for example, by the column control circuit 201.

Then, whether all bits pass or not is determined at a step ST7. When not passing (i.e. "NO"), whether the number of repetitions in the loop sequence reaches a prescribed number or not is determined at a step ST8. When the number of repetitions does not reach the prescribed number (i.e. "NO"), the steps ST3 to ST7 are repeated again after going back to the step ST3.

When the number of repetitions reaches the prescribed number (i.e. "YES"), whether the information is programmed at B-LEVEL or not is determined after proceeding to a step ST9. When the information is determined to be programmed at other than B-LEVEL (i.e. "NO"), the program suppression voltage Vdd (inhibit) is applied to a bit line BL as shown in FIG. 10. Thereafter, the steps ST3 to ST7 are repeated again after going back to the step ST3.

When the information is determined to be programmed at B-LEVEL (i.e. "YES"), the voltage of the bit line BL is changed from the program suppression voltage Vdd (Inhibit) to the program selection voltage Vss (Select) as shown in a step ST11. In this manner, in the first embodiment, programming at B-LEVEL is started at a time t2 shown in FIG. 5 with a delay by the prescribed number of the repetitions in the loop sequence from the start of programming at A-LEVEL. Then, after going back to the step ST3, the steps ST3 to ST7 are repeated again. These voltage changes in the bit line BL are also performed, for example, by the column control circuit 201.

(B-Level Program)

When being determined to pass at the step ST7 (i.e. "YES"), the program operation is performed after proceeding to a step ST 12 in FIG. 7. Then, whether a threshold voltage of a memory cell MC is raised up to B-LEVEL or not is verified as shown in a step ST13. In the verify-read operation of the step ST13, the read operation is performed (at a time t3 in FIG. 5) under a verify-read voltage Vvb (see FIG. 4) in the selected word line WL. When the memory cell MC is turned "on", the threshold voltage thereof is determined not to be raised up to B-LEVEL (determined not to pass, i.e. "NO") at a step ST14. In this case, for example, the column control circuit 201 applies the program selection voltage Vss (Select) to the bit line BL, and causes the threshold voltage to be shifted again in the next program operation.

When the memory cell MC is turned "off", the threshold voltage is determined to be raised up to B-LEVEL (determined to pass, i.e. "YES"). Then, as shown in a step ST15, for example, the column control circuit 201 changes the voltage of the bit line BL from the program selection voltage Vss (Select) to the program suppression voltage Vdd (inhibit). Thereby, a shift of the threshold voltage is suppressed in the next and following program operations.

Then, as shown in a step ST16, whether all bits pass or not is determined. When not passing (i.e. "NO"), whether the number of repetitions in a loop sequence reaches the prescribed number or not is determined. When the number of repetitions does not reach the prescribed number (i.e. "NO"), the steps ST12 to ST 16 are repeated again.

When the number of repetitions reaches the prescribed number (i.e. "YES"), whether the information is programmed at C-LEVEL or not is determined after proceeding to a step ST18. When being determined to be programmed at other than C-LEVEL (i.e. "NO"), for example, the column control circuit 201 applies the program suppression voltage Vdd (inhibit) to a bit line BL as shown in a step ST19. Thereafter, the steps ST12 to ST16 are repeated again.

When being determined to be programmed at C-LEVEL (i.e. "YES"), for example, the column control circuit 201 changes the voltage of the bit line BL from the program suppression voltage Vdd (inhibit) to the program selection voltage Vss (Select) as shown in a step ST20. Thereby, programming at C-LEVEL is started at a time t4 in FIG. 5 with a delay by the prescribed number of the repetitions in the loop sequence from the start of programming at B-LEVEL. Then, the steps ST12 to ST16 are repeated again.

(C-Level Program)

When passing at the step ST16 (i.e. "YES"), the program operation is performed after proceeding to a step ST21 in FIG. 8. Then, whether a threshold voltage of a memory cell MC is raised up to C-LEVEL or not is verified as shown in a step ST22. In a verify-read operation of the step ST22, the read operation is preformed (at a time t5 in FIG. 5) under a verify-read voltage Vvc (see FIG. 4) applied to the selected word line WL. When the memory cell MC is turn "on", the threshold voltage thereof is determined not to be raised up to C-LEVEL (determined not to pass, i.e. "NO") at a step ST23. The column control circuit 201 applies the program selection voltage Vss (Select) to a bit line BL. The threshold voltage is shifted again in the following program operation.

When the memory cell MC is turn "off", the threshold voltage thereof is determined to be raised up to C-LEVEL (determined to pass, i.e. "YES"). The column control circuit 201 changes the voltage of the bit line BL from the program selection voltage Vss (Select) to the program suppression voltage Vdd (inhibit) as shown in a step ST24. A shift of the threshold voltage is suppressed in the next and following program operations.

Then, whether all bits pass or not is determined as shown in a step ST25. When not passing (i.e. "NO"), the steps ST21 to ST25 are repeated again. When passing (i.e. "YES"), programming the information that corresponds to "one page" is ended (at a time t6 in FIG. 5).

In this manner, when starting the A-LEVEL programming, the program selection voltage Vss (Select) is applied to a channel of the memory cell MC in which programming at A-LEVEL is performed, and the program suppression voltage Vdd (Inhibit) is applied to a channel of the memory cell MC in which programming at other than A-LEVEL is performed. In such a manner, the memory cells MC, in which voltages of channels are almost the same as the voltage Vdd, are increased at an initial stage of the A-LEVEL programming. Thereby, in the program operation, for example, at the initial stage of the A-LEVEL programming, increase of parasitic capacity is suppressed between word lines WL and channels 20.

In such a case of the first embodiment, it is possible to suppress the RC time constant of word lines WL to be small, for example, at an initial stage of A-LEVEL programming, comparing to a case where the program selection voltage Vss (Select) is applied to channels of memory cells MC in which A-LEVEL, B-LEVEL and C-LEVEL programming are performed respectively. Thereby, it is possible to improve the operation rate in programming.

Moreover, in the first embodiment, as the RC time constant of word lines WL is suppressed to be small at the initial stage of A-LEVEL programming, it is possible to reduce a difference in the RC time constant between the worst case and the best case (i.e. a variation range of the RC time constant). Further, it is also possible to suppress a case where programming in a memory cell MC becomes excessively easy. Thus, according to the first embodiment, it is possible in the program operation to suppress an occurrence of erroneous programming such as disturbances in programming or passing, or programmed at a wrong level.

Furthermore, in the first embodiment, timing of start in B-LEVEL programming or C-LEVEL programming is determined based on the number of repetitions in the loop sequence. Thus, it can be achieved, for example, by only providing a counter circuit in the column control circuit 201. The counter circuit counts, for example, the number of repetitions in the loop sequence. Thus, determining the timing of start in B-LEVEL programming or C-LEVEL programming based on the number of repetitions is advantageous for suppressing a degree of complexity in the column control circuit 201.

Second Embodiment

Figure 15:
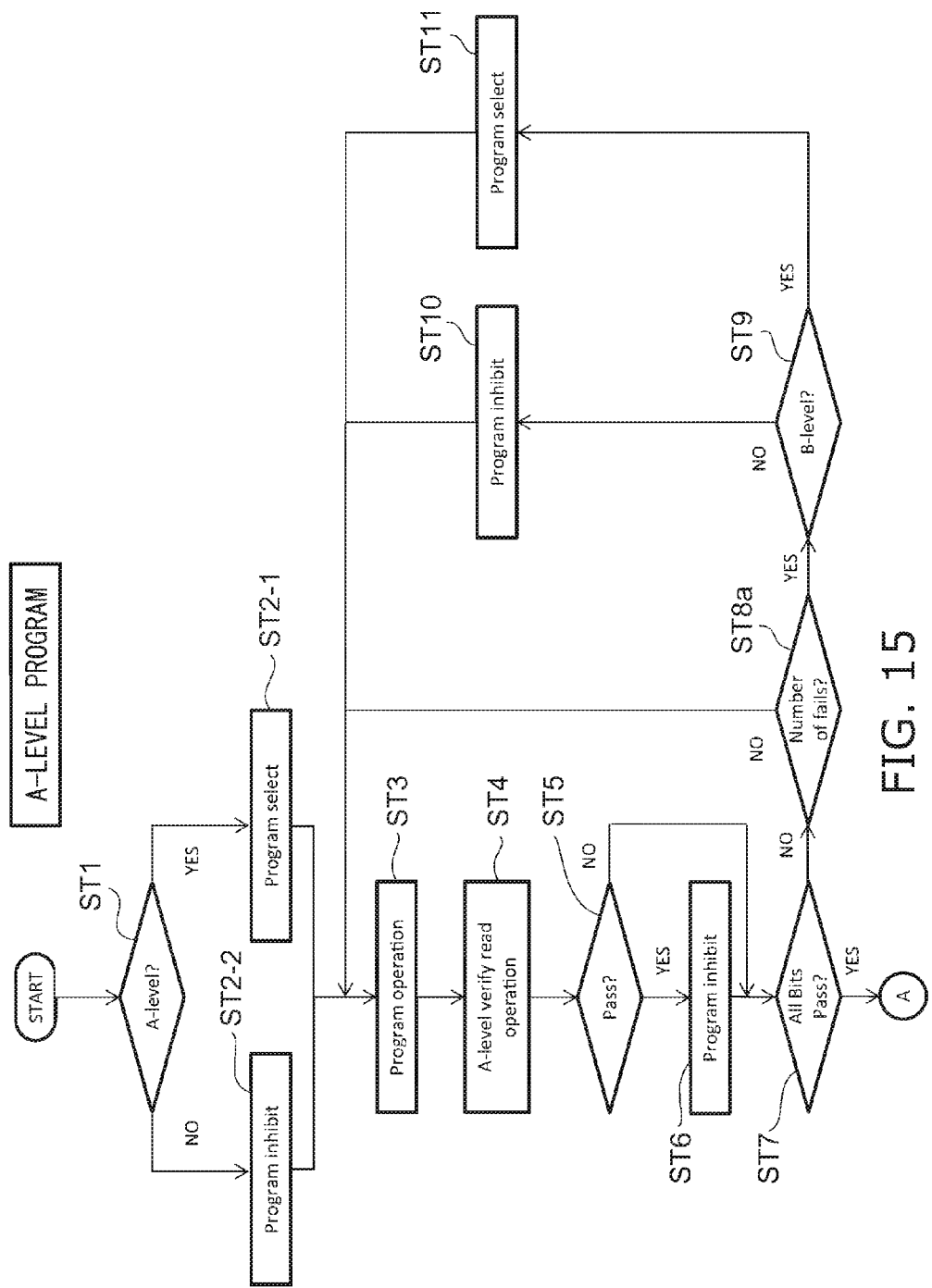
FIG. 15 is a flow chart showing A-LEVEL PROGRAM flow in a semiconductor device according to a second embodiment.

FIG. 15 is a flow chart showing A-LEVEL PROGRAM flow in a semiconductor device according to a second embodiment.

As shown in FIG. 15, the second embodiment is different in a step ST8a from the first embodiment. In the first embodiment, B-LEVEL programming starts with a delay by the prescribed number of the repetitions in the loop sequence from the start of A-LEVEL programming. In contrast, in the second embodiment, B-LEVEL programming starts when the number of fail bits is reduced to be equal to or smaller than a prescribed value after the start of A-LEVEL programming. The "fail bits" correspond to bit lines BL that are connected respectively to memory cells MC in which threshold voltages are not raised up to A-LEVEL. The fail bits are determined in the verify-read operation (ST4, ST5).

The memory cells MC in which the threshold voltages are raised up to A-LEVEL are gradually increased by repeating the loop sequence including the steps ST3 and ST4. Thereby, the memory cells MC having channels biased at the voltage Vdd are gradually increased, and the parasitic capacity is gradually lowered between word lines WL and channels 20. In contrast, the number of fail bits is gradually reduced.

In the second embodiment, proceeding to the step ST9 is set to be triggered by the number of fail bits that is reduced to be equal to or smaller than a prescribed value, focusing on the number of residual fail bits.

In this manner, the B-LEVEL programming may start when the number of fail bits is equal to or smaller than a prescribed number after the start of A-LEVEL programming. Although not shown specifically in a figure, in the step ST17 shown in FIG. 7, proceeding to the step ST18 may be set to be triggered by the number of fail bits being equal to or smaller than a prescribed value.

The number of residual fail bits reflects an actual size of parasitic capacity in a more realistic way comparing to the number of repetitions in the loop sequence. Thus, it is advantageous when performing the program operation according to the embodiment with accuracy comparing to the case, for example, based on the number of repetitions in the loop sequence.

Also, there may be cases, in one semiconductor device, based both on the number of repetitions in the loop sequence and on the number of residual fail bits.

As mentioned above, according to the embodiments, it is possible to achieve a semiconductor device capable of reducing capacity between word lines and channels in the program operation.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a plurality of memory strings, the memory strings including a plurality of memory cells connected in series, the memory cells each including a gate electrode, a channel and a charge storage portion, the gate electrode surrounding the channel, and the charge storage portion being provided between the gate electrode and the channel;
a plurality of word lines, the word lines being electrically connected to gate electrodes of the memory cells respectively;
a plurality of bit lines being electrically connected to ends of current paths in the memory strings respectively; and
a circuit controlling a program operation of information, the information including at least three of a first level, a second level and a third level, or more corresponding to threshold voltages of the memory cells,
a threshold voltage of the second level being higher than a threshold voltage of the first level,
a threshold voltage of the third level being higher than the threshold voltage of the second level, and
when starting the program operation, the circuit applying a program selection voltage to channels of memory cells to be programmed at the second level, and a program suppression voltage to channels of memory cells maintaining the first level and channels of memory cells to be programmed at the third level, the program suppression voltage being higher than the program selection voltage.

2. The semiconductor device according to claim 1, wherein
a loop sequence repeating first and second operations is performed in the program operation of information, the first operation causing threshold voltages of memory cells to shift, and the second operation verifying the threshold voltages of the memory cells.

3. The semiconductor device according to claim 2, wherein
the circuit changes a voltage based on the number of repetitions in the loop sequence from the program suppression voltage to the program selection voltage, the voltage being applied to channels of memory cells to be programmed at the third level.

4. The semiconductor device according to claim 3, wherein
the circuit changes a voltage from the program suppression voltage to the program selection voltage after the number of repetitions reaches a prescribed number, the voltage being applied to the channels of the memory cells to be programmed at the third level.

5. The semiconductor device according to claim 2, wherein
the circuit changes a voltage based on a result of the second operation from the program suppression voltage to the program selection voltage, the voltage being applied to channels of memory cells to be programmed at the third level.

6. The semiconductor device according to claim 5, wherein
the circuit changes a voltage from the program suppression voltage to the program selection voltage after the number of fail bits determined by the second operation is equal to or smaller than a prescribed value, the voltage being applied to the channels of memory cells to be programmed at the third level.

7. The semiconductor device according to claim 5, wherein, before starting the first operation, the circuit applied the program suppression voltage or the program selection voltage to the bit lines corresponding to a data pattern to be programmed.

8. The semiconductor device according to claim 7, wherein, before starting the first operation, the program suppression voltage or the program selection voltage is applied to channels of the memory cells from the bit lines.

9. The semiconductor device according to claim 8, wherein
a voltage of one word line selected from the word lines is raised from a first voltage to a second voltage higher than the first voltage after the program suppression voltage or the program selection voltage is applied to the channels of the memory cells.

10. The semiconductor device according to claim 2, wherein
the circuit changes a voltage based on a result of the second operation from the program selection voltage to the program suppression voltage, the voltage being applied to channels of memory cells to be programmed at the second level.

11. The semiconductor device according to claim 10, wherein
the circuit changes a voltage applied to the channels of the memory cells from the program selection voltage to the program suppression voltage after threshold voltages of the memory cells programmed at the second level are determined in the second operation to reach a threshold voltage corresponding to the second level.

12. The semiconductor device according to claim 2, wherein
the first operation and the second operation are performed in parallel with respect to the memory cells.

13. A semiconductor device comprising:
a plurality of memory cells, the memory cells each storing information as at least three of a first level, a second level and a third level, or more, a threshold voltage of a memory cell storing the second level being higher than a threshold voltage of a memory cell storing the first level, and a threshold voltage of a memory cell storing the third level being higher than the threshold voltage of the memory cell storing the second level;
a plurality of word lines, the word lines being electrically connected to gate electrodes of the memory cells respectively;
a plurality of bit lines, the bit lines being electrically connected to ends of channels in the memory cells respectively; and
a circuit controlling a program operation of information, the circuit performing, in the programming operation, a loop sequence repeating a first operation and a second operation, the first operation causing threshold voltages of the memory cells to shift, and the second operation verifying the threshold voltages of the memory cells;
the circuit, when starting the program operation, applying a program selection voltage to channels of memory cells to be programmed at the second level, and applying a program suppression voltage higher than the program selection voltage to channels of memory cells maintaining the first level and to channels of memory cells to be programmed at the third level; and the circuit changing a voltage from the program suppression voltage to the program selection voltage based on at least one of the number of repetitions in the loop sequence and a result of the second operation, the voltage being applied to the channels of the memory cells to be programmed at the third level.

14. The semiconductor device according to claim 13, wherein the circuit changes a voltage from the program suppression voltage to the program selection voltage after the number of repetitions reaches a prescribed number, the voltage being applied to the channels of memory cells to be programmed at the third level.

15. The semiconductor device according to claim 13, wherein the circuit changes a voltage from the program suppression voltage to the program selection voltage after the number of fail bits determined in the second operation is equal to or smaller than a prescribed value, the voltage being applied to the channels of memory cells to be programmed at the third level.

16. The semiconductor device according to claim 13, wherein, before starting the first operation, the circuit applied the program suppression voltage or the program selection voltage to the bit lines corresponding to a data pattern to be programmed.

17. The semiconductor device according to claim 16, wherein, before starting the first operation, the program suppression voltage or the program selection voltage is applied to channels of the memory cells from the bit lines.

18. The semiconductor device according to claim 17, wherein a voltage of one word line selected from the word lines is raised from a first voltage to a second voltage higher than the first voltage after the program selection voltage or the program suppression voltage is applied to the channels of the memory cells.

19. The semiconductor device according to claim 13, wherein the circuit changes a voltage applied to the channels of the memory cells from the program selection voltage to the program suppression voltage after threshold voltages of the memory cells programmed at the second level are determined in the second operation to reach a threshold voltage corresponding to the second level.

20. A method for operating a semiconductor device, the semiconductor device programming information into a plurality of memory cells, the information including at least three of a first level, a second level and a third level or more, the method comprising:

applying a program selection voltage to a channel of a memory cell to be programmed at the second level;

applying a program suppression voltage to a channel of a memory cell maintaining the first level and to a channel of a memory cell to be programmed at the third level, the program suppression voltage being higher than the program selection voltage;

performing a loop sequence including a first operation and a second operation, the first operation causing threshold voltages of the memory cells to shift, and the second operation verifying the threshold voltages of the memory cells; and delaying, based on at least one of the number of repetitions in the loop sequence and a result of the second operation, the timing of applying the program selection voltage to the channel of the memory cell to be programmed at the third level from the timing of applying the program selection voltage to the channel of the memory cell to be programmed at the second level.

* * * * *